United States Patent
Chen

(10) Patent No.: US 9,253,894 B2
(45) Date of Patent: Feb. 2, 2016

(54) ELECTRONIC ASSEMBLY WITH DETACHABLE COMPONENTS

(71) Applicant: Wintec Industries, Inc., Milpitas, CA (US)

(72) Inventor: Kong-Chen Chen, San Jose, CA (US)

(73) Assignee: Wintec Industries, Inc., Milpitas, CA (US)

( * ) Notice: Subject to any disclaimer, the term of this patent is extended or adjusted under 35 U.S.C. 154(b) by 0 days.

(21) Appl. No.: 13/973,766

(22) Filed: Aug. 22, 2013

(65) Prior Publication Data

US 2013/0342998 A1 Dec. 26, 2013

Related U.S. Application Data

(63) Continuation of application No. 11/593,788, filed on Nov. 6, 2006, now abandoned, which is a continuation-in-part of application No. 11/351,418, filed on Feb. 10, 2006, now Pat. No. 7,928,591.

(60) Provisional application No. 60/652,217, filed on Feb. 11, 2005.

(51) Int. Cl.
*H01L 23/00* (2006.01)
*H05K 3/30* (2006.01)
(Continued)

(52) U.S. Cl.
CPC .......... *H05K 3/303* (2013.01); *H01L 21/67259* (2013.01); *H01L 22/32* (2013.01); *H01L 22/34* (2013.01); *H01L 23/041* (2013.01); *H01L 23/10* (2013.01); *H01L 23/4093* (2013.01); *H01L 23/544* (2013.01); *H01L 24/29* (2013.01); *H01L 24/32* (2013.01); *H01L 24/33* (2013.01);
(Continued)

(58) Field of Classification Search
None
See application file for complete search history.

(56) References Cited

U.S. PATENT DOCUMENTS 3,992,073 A 11/1976 Buchoff et al.
4,209,481 A 6/1980 Kashiro et al.
(Continued)

FOREIGN PATENT DOCUMENTS

CN 1343007 A 4/2002
CN 1420557 A 5/2003
(Continued)

OTHER PUBLICATIONS

Non-Final Office Action for U.S. Appl. No. 13/612,537, mailed on Aug. 25, 2014, 29 pages.
(Continued)

*Primary Examiner* — Benjamin Sandvik
(74) *Attorney, Agent, or Firm* — Alston & Bird LLP

(57) ABSTRACT

An electronic assembly including a substrate, an electronic component, a fixture, and a housing. The substrate includes a first contact array. The electronic component includes a second contact array. The fixture includes an opening adapted to position the electronic component on the substrate and to connect the second contact array to the first contact array when the fixture is aligned at a first position on the substrate. The housing is adapted to hold the substrate populated with the electronic component. The housing includes a first conductive pathway adapted to connect from an external surface at the housing to the substrate in a serial continuous conductive path when the fixture is aligned at the first position on the substrate. The electronic assembly includes a sensing device connected to the continuous conductive path to detect the integrity of the electronic assembly.

44 Claims, 10 Drawing Sheets

(51) Int. Cl.
*H01L 21/66* (2006.01)
*H01L 21/67* (2006.01)
*H01L 23/04* (2006.01)
*H01L 23/10* (2006.01)
*H01L 23/40* (2006.01)
*H01L 23/544* (2006.01)
*H01L 25/065* (2006.01)
*H05K 1/14* (2006.01)
*H05K 3/32* (2006.01)
*H05K 1/16* (2006.01)
*H05K 7/20* (2006.01)
*H01L 23/48* (2006.01)
*H05K 1/02* (2006.01)
*H05K 3/22* (2006.01)

(52) U.S. Cl.
CPC ............ *H01L24/72* (2013.01); *H01L 25/0655* (2013.01); *H05K 1/0296* (2013.01); *H05K 1/144* (2013.01); *H05K 1/16* (2013.01); *H05K 3/325* (2013.01); *H05K 7/20436* (2013.01); *H01L 23/481* (2013.01); *H01L 2223/5446* (2013.01); *H01L 2223/54426* (2013.01); *H01L 2223/54466* (2013.01); *H01L 2223/54473* (2013.01); *H01L 2224/29* (2013.01); *H01L 2224/2929* (2013.01); *H01L 2224/2939* (2013.01); *H01L 2224/29101* (2013.01); *H01L 2224/29444* (2013.01); *H01L 2924/00013* (2013.01); *H01L 2924/014* (2013.01); *H01L 2924/0105* (2013.01); *H01L 2924/01006* (2013.01); *H01L 2924/01033* (2013.01); *H01L 2924/01078* (2013.01); *H01L 2924/01079* (2013.01); *H01L 2924/14* (2013.01); *H01L 2924/15192* (2013.01); *H01L 2924/19041* (2013.01); *H01L 2924/19042* (2013.01); *H01L 2924/19043* (2013.01); *H05K 1/0268* (2013.01); *H05K 3/222* (2013.01); *H05K 2201/0314* (2013.01); *H05K 2201/10159* (2013.01); *H05K 2201/10378* (2013.01); *H05K 2203/167* (2013.01); *Y10T 29/49004* (2015.01); *Y10T 29/49133* (2015.01)

(56) References Cited

U.S. PATENT DOCUMENTS

| | | | |
|---|---|---|---|
| 4,833,621 A | 5/1989 | Umatate | |
| 5,134,364 A | 7/1992 | Karpman et al. | |
| 5,139,862 A | 8/1992 | Swift et al. | |
| 5,194,695 A | 3/1993 | Maslakow | |
| 5,254,953 A | 10/1993 | Crook et al. | |
| 5,302,854 A | 4/1994 | Nishiguchi et al. | |
| 5,477,009 A | 12/1995 | Brendecke et al. | |
| 5,489,749 A | 2/1996 | DiStefano et al. | |
| 5,661,042 A | 8/1997 | Fang et al. | |
| 5,862,147 A | 1/1999 | Terauchi | |
| 5,909,122 A | 6/1999 | Chung et al. | |
| 6,057,700 A | 5/2000 | Crispell | |
| 6,081,040 A | 6/2000 | Okuda | |
| 6,097,203 A | 8/2000 | Parker et al. | |
| 6,127,254 A | 10/2000 | Diebold et al. | |
| 6,137,063 A | 10/2000 | Jiang | |
| 6,181,567 B1 | 1/2001 | Roemer et al. | |
| 6,215,321 B1 | 4/2001 | Nakata | |
| 6,245,582 B1 | 6/2001 | Yamaguchi et al. | |
| D444,401 S | 7/2001 | Campbell | |
| D444,720 S | 7/2001 | Campbell | |
| 6,278,193 B1 | 8/2001 | Coico et al. | |
| 6,281,695 B1 | 8/2001 | Chung et al. | |
| 6,288,426 B1 | 9/2001 | Gauthier et al. | |
| 6,373,273 B2 * | 4/2002 | Akram et al. | 324/756.05 |
| 6,376,263 B1 | 4/2002 | Franz | |
| 6,385,223 B1 | 5/2002 | Kurihara | |
| 6,474,997 B1 | 11/2002 | Ochiai | |
| 6,503,089 B2 | 1/2003 | Saijo et al. | |
| 6,518,679 B2 | 2/2003 | Lu et al. | |
| 6,518,780 B1 | 2/2003 | Campbell et al. | |
| 6,522,518 B1 | 2/2003 | Barnett | |
| 6,548,827 B2 | 4/2003 | Irie | |
| 6,579,430 B2 | 6/2003 | Davis et al. | |
| 6,628,136 B2 | 9/2003 | Roberts et al. | |
| 6,650,131 B2 | 11/2003 | Campbell et al. | |
| 6,660,541 B2 | 12/2003 | Kanamaru et al. | |
| 6,775,153 B2 | 8/2004 | Hashimoto | |
| 6,802,720 B2 | 10/2004 | Weiss et al. | |
| 6,809,535 B2 | 10/2004 | Campbell | |
| 6,878,435 B2 | 4/2005 | Paik et al. | |
| 6,914,259 B2 | 7/2005 | Sakiyama et al. | |
| 6,944,567 B2 | 9/2005 | Beffa | |
| 7,001,792 B2 | 2/2006 | Sauer et al. | |
| 7,009,683 B2 | 3/2006 | Sato | |
| 7,063,542 B2 | 6/2006 | Weiss et al. | |
| 7,077,659 B2 | 7/2006 | Weiss et al. | |
| 7,202,678 B2 | 4/2007 | Campbell et al. | |
| 7,224,174 B1 | 5/2007 | Malendevich et al. | |
| 7,232,758 B2 | 6/2007 | Chen | |
| 7,253,443 B2 | 8/2007 | Yoshida et al. | |
| 7,358,604 B2 | 4/2008 | Heyen et al. | |
| 7,402,897 B2 | 7/2008 | Leedy | |
| 7,654,816 B2 | 2/2010 | Chen | |
| 7,928,591 B2 | 4/2011 | Chen | |
| 8,344,376 B2 | 1/2013 | Chen | |
| 8,350,393 B2 | 1/2013 | Chen | |
| 8,530,248 B2 | 9/2013 | Chen | |
| 8,535,955 B2 | 9/2013 | Chen | |
| 8,536,572 B2 | 9/2013 | Chen | |
| 8,547,707 B2 | 10/2013 | Chen | |
| 2002/0000815 A1 | 1/2002 | Fjelstad et al. | |
| 2002/0030501 A1 | 3/2002 | Ohtaki | |
| 2002/0043101 A1 | 4/2002 | Naitou et al. | |
| 2002/0095304 A1 | 7/2002 | Khazei | |
| 2002/0096746 A1 | 7/2002 | Cokely et al. | |
| 2002/0105078 A1 | 8/2002 | Lee et al. | |
| 2002/0105347 A1 | 8/2002 | Maruyama et al. | |
| 2002/0140107 A1 | 10/2002 | Kato et al. | |
| 2002/0142494 A1 | 10/2002 | Farnworth et al. | |
| 2002/0158323 A1 | 10/2002 | Iwasaki | |
| 2002/0191835 A1 * | 12/2002 | Lu et al. | 382/151 |
| 2002/0195706 A1 | 12/2002 | Irie | |
| 2003/0085461 A1 | 5/2003 | Sakiyama et al. | |
| 2003/0113944 A1 | 6/2003 | Kanamaru et al. | |
| 2003/0181071 A1 | 9/2003 | Weiss et al. | |
| 2004/0016930 A1 | 1/2004 | Yoshida et al. | |
| 2004/0024551 A1 | 2/2004 | Beffa | |
| 2004/0164752 A1 | 8/2004 | Crook et al. | |
| 2004/0196682 A1 | 10/2004 | Funaba et al. | |
| 2004/0262036 A1 | 12/2004 | Brist et al. | |
| 2004/0266272 A1 | 12/2004 | Maruyama et al. | |
| 2005/0009386 A1 | 1/2005 | Weiss et al. | |
| 2005/0040836 A1 | 2/2005 | Altmann et al. | |
| 2005/0059173 A1 | 3/2005 | Chuan et al. | |
| 2005/0070133 A1 | 3/2005 | Canella | |
| 2005/0074909 A1 | 4/2005 | Steeples | |
| 2005/0128453 A1 | 6/2005 | Miura | |
| 2005/0167795 A1 | 8/2005 | Higashi | |
| 2005/0253993 A1 | 11/2005 | Chen | |
| 2006/0103391 A1 | 5/2006 | Parker | |
| 2006/0115927 A1 | 6/2006 | Yeo et al. | |
| 2007/0020812 A1 | 1/2007 | Hsu et al. | |
| 2007/0187844 A1 | 8/2007 | Chen | |
| 2007/0210438 A1 | 9/2007 | Briere et al. | |
| 2007/0271781 A9 | 11/2007 | Beaman et al. | |
| 2011/0119906 A1 | 5/2011 | Chen | |
| 2011/0119907 A1 | 5/2011 | Chen | |
| 2011/0121293 A1 | 5/2011 | Chen | |
| 2011/0121841 A1 | 5/2011 | Chen | |
| 2011/0164951 A1 | 7/2011 | Chen | |
| 2011/0210329 A1 | 9/2011 | Chen | |
| 2011/0212549 A1 | 9/2011 | Chen | |
| 2011/0222252 A1 | 9/2011 | Chen | |

(56) References Cited

U.S. PATENT DOCUMENTS

| | | |
|---|---|---|
| 2011/0222253 A1 | 9/2011 | Chen |
| 2011/0223695 A1 | 9/2011 | Chen |
| 2011/0228506 A1 | 9/2011 | Chen |
| 2011/0241708 A1 | 10/2011 | Chen |
| 2013/0000095 A1 | 1/2013 | Chen |
| 2013/0000104 A1 | 1/2013 | Chen |

FOREIGN PATENT DOCUMENTS

| | | |
|---|---|---|
| CN | 101118899 B | 4/2012 |
| GB | 2412790 A | 5/2005 |
| GB | 2448959 B | 10/2011 |
| JP | 11-054560 A | 2/1999 |
| JP | 2000-100873 A | 4/2000 |
| JP | 2000-258494 A | 9/2000 |
| JP | 2005-072626 A | 3/2005 |
| JP | 2005-217071 A | 8/2005 |
| WO | 2005/015632 A1 | 2/2005 |
| WO | 2007/095100 A2 | 8/2007 |

OTHER PUBLICATIONS

Non-Final Office Action for U.S. Appl. No. 13/612,548, mailed on Aug. 29, 2014, 20 pages.
Non-Final Office Action for U.S. Appl. No. 13/157,543, mailed on Sep. 30, 2014, 29 pages.
China Intellectual Property Office office action for patent application CN201210029477.3 (Sep. 2, 2014).
China Intellectual Property Office office action for patent application CN201210029480.5 (Sep. 5, 2014).
China Intellectual Property Office office action for patent application CN201210029462.7 (Aug. 27, 2014).
Notice of Allowance for U.S. Appl. No. 11/351,418, mailed on Sep. 20, 2010, 10 pages.
Office Action for U.S. Appl. No. 11/351,418, mailed on Nov. 24, 2009, 14 pages.
Office Action for U.S. Appl. No. 11/593,788, mailed on Dec. 7, 2010, 16 pages.
Office Action for U.S. Appl. No. 11/593,788, mailed on Jun. 23, 2010, 16 pages.
Office Action for U.S. Appl. No. 11/593,788, mailed on Feb. 4, 2010 18 pages.
Office Action for U.S. Appl. No. 11/593,788, mailed on Jun. 4, 2009, 13 pages.
Office Action for U.S. Appl. No. 12/779,046, mailed on Jan. 5, 2012, 11 pages.
Examination Report for DE Patent Application No. 112007000316.2, mailed on Oct. 15, 2010, 6 pages.
Examination Report for GB Patent Application No. GB0803726.9, mailed on Sep. 28, 2010, 3 pages.
Examination Report for GB Patent Application No. GB0803726.9, mailed on Jul. 7, 2011, 2 pages.
Substantive Examination Adverse Report for Malaysia Patent Application No. PI 20080463, mailed on Jun. 30, 2010, 3 pages.
Office Action of Japanese Application No. 2008-554381, dated Aug. 9, 2011, 8 pages total.
Second Office Action of Chinese Application No. 200780001159.3, dated Mar. 24, 2010, 27 pages total.
First Office Action of Chinese Application No. 200780001159.3, dated Sep. 11, 2009, 14 pages total.
PCT International Search Report and Written Opinion of PCT Application No. PCT/US 07/03519, dated Nov. 28, 2007, 12 pages.
Office Action for U.S. Appl. No. 12/835,926, mailed on Nov. 17, 2011, 8 pages.
First Office Action of Chinese Application No. 200610109038.8, dated Apr. 2, 2010, 9 pages total.
Second Office Action of Chinese Application No. 200610109038.8, dated May 31, 2011, 11 pages total.
Examination Report for Malaysia Patent Application No. PI 20080463, mailed on Mar. 30, 2012, 45 pages.
Examination Report for Malaysia Patent Application No. PI 20063695, mailed on Mar. 31, 2011, 2 pages.
Third Office Action of Chinese Application No. 200780001159.3, mailed Nov. 2, 2011, 8 pages.
Fourth Office Action of Chinese Application No. 200780001159.3, mailed Jun. 1, 2012, 14 pages.
Office Action for U.S. Appl. No. 12/779,046, mailed on Jul. 20, 2012, 31 pages.
Office Action for U.S. Appl. No. 12/779,047, mailed on Jul. 10, 2012, 34 pages.
Office Action for U.S. Appl. No. 12/835,926, mailed on May 1, 2012, 15 pages.
First Office Action of Taiwan Patent Application No. 096141775, dated May 28, 2012, 8 pages.
Office Action for German Patent Application No. 112007000316.2, dated Aug. 23, 2012, 6 pages.
Examination Report for Malaysia Patent Application No. PI 20063695, mailed on Aug. 30, 2012, 3 pages.
Office Action for U.S. Appl. No. 12/835,914, mailed on Sep. 20, 2012, 25 pages.
Office Action for U.S. Appl. No. 12/779,048, mailed on Sep. 27, 2012, 27 pages.
Office Action for U.S. Appl. No. 12/779,049, mailed on Oct. 4, 2012, 16 pages.
Office Action for U.S. Appl. No. 12/779,052, mailed on Oct. 4, 2012, 23 pages.
Office Action for U.S. Appl. No. 12/835,917, mailed on Oct. 5, 2012, 17 pages.
Office Action for U.S. Appl. No. 12/779,051, mailed on Oct. 5, 2012, 32 pages.
Notice of Allowance for U.S. Appl. No. 12/779,046, mailed on Oct. 30, 2012, 13 pages.
Office Action for Japanese Patent Application No. 2008-554381, mailed Oct. 16, 2012, 5 pages.
Notice of Allowance for U.S. Appl. No. 12/779,047, mailed on Nov. 26, 2012, 18 pages.
Office Action for U.S. Appl. No. 12/835,922, mailed on Dec. 28, 2012, 21 pages.
Certificate of Grant for Malaysia Patent Application No. PI 20063695, dated Oct. 15, 2012, 3 pages.
Notice of Issuance for Chinese Application No. 200780001159.3, mailed Dec. 19, 2012, 4 pages.
Final Office Action for U.S. Appl. No. 12/835,914 mailed Jan. 14, 2013.
Daisy Chain (electrical engineering) Wikipedia article available at http://en.wikipedia.org/wiki/Daisy_chain_(electrical_engineering) (Mar. 2008 last updated Jan. 2013).
German Patent Office (DPMA) Communication from Examiner for application DE112007000316.2 (Jan. 24, 2013).
German Patent Office (DPMA) Office Action for application DE112007000316.2 (Mar. 26, 2013).
Non-Final action for U.S. Appl. No. 12/779,048 (Apr. 16, 2013).
Ex parte Quayle action for U.S. Appl. No. 12/779,049 (Apr. 4, 2013).
Ex parte Quayle action for U.S. Appl. No. 12/779,051 (Apr. 4, 2013).
Ex parte Quayle action for U.S. Appl. No. 12/779,052 (Apr. 4, 2013).
Final Office Action for U.S. Appl. No. 12/835,922 mailed Apr. 26, 2013.
Non-Final Office Action for U.S. Appl. No. 11/593,788 mailed Apr. 22, 2013.
Final Office Action for U.S. Appl. No. 12/835,917 mailed Apr. 24, 2013.
Notice of Allowance for U.S. Appl. No. 12/779,049, mailed on Jul. 25, 2013, 4 pages.
Notice of Allowance for U.S. Appl. No. 12/779,051, mailed on Jul. 26, 2013, 9 pages.
Notice of Allowance for U.S. Appl. No. 12/779,052, mailed on Jul. 25, 2013, 6 pages.
Notice of Allowance for U.S. Appl. No. 13/049,302, mailed on Jul. 2, 2014, 9 pages.

* cited by examiner

ELECTRONIC ASSEMBLY WITH DETACHABLE COMPONENTS

CROSS-REFERENCES TO RELATED APPLICATIONS

This application is a continuation of commonly assigned U.S. Non-Provisional application Ser. No. 11/593,788 titled "Electronic Assembly With Detachable Components" filed Nov. 6, 2006, which is a continuation-in-part of commonly assigned U.S. Non-Provisional application Ser. No. 11/351,418 titled "Apparatus and Method for Predetermined Component Placement to a Target Platform" filed Feb. 10, 2006, now U.S. Pat. No. 7,928,591, which claims priority to commonly assigned U.S. Provisional Application No. 60/652,217 filed Feb. 11, 2005, the contents of all of which are incorporated herein by reference in their entirety.

BACKGROUND

1. Field of the Invention

The present invention relates generally to electronic assemblies, and more particularly to assembly techniques on the use of anisotropic conducting material as a component interconnect and the use of substrate embossed with placement cavities or the use of positional fixtures to facilitate the placement of component on the substrate in an electronic assembly.

2. Related Art

Electronic assemblies are typically assembled by using surface mount technology (SMT), or more recently, the chip-on-board (COB) technology. Using SMT, packaged electronic components are soldered on a substrate, such as a printed circuit board (PCB), by printing a thin layer of solder paste on the substrate and following a thermal reflow process to solder the component to the substrate. Using COB technology, thin metal wires are attached or bonded to a bare die on a substrate to create a wire-bonded assembly. A layer of resin may then be applied to the surface of wire-bonded component to protect the bonded wires from being damaged in the assembly.

One problem with both the SMT and the COB technique is that a soldered or wire-bonded component is typically difficult to remove for repair or reuse once it is attached to the substrate. At motherboards, sockets are often used for the installation of CPU chips to simplify its replacement or upgrade. The sockets are rather expensive. Therefore, there is a need for assembly techniques that allow components to be easily detached from the substrate for rework, reuse, or even replacement.

SUMMARY

The present invention addresses the above problems with an assembly technique, which uses anisotropic conducting membrane (ACM) at a component interconnect interface and uses a substrate with embossed cavities or with an aligning fixture to facilitate the assembly of components on substrate in an electronic assembly. The aligning fixture comprises openings at predetermined spatial regions in the fixture. The embossed cavity on the substrate or the opening at the fixture is chosen in such a way that it enables a contact array of a component to match a designated land pattern on a substrate when the component is placed at the cavity or opening. The embossed cavities on the substrate or the openings in the fixture can also hold ACM interfaced components in place on the substrate after the components are placed. The ACM layer electrically connects component to the substrate and enables component to be readily detached for reuse or replacement. An ACM layer may be directly laminated at a component surface. Alternatively, the ACM layer may be placed at the substrate surface during the assembly process.

An alignment chain can monitor the positional and contact integrity for a group of components on a substrate in an electronic assembly. By incorporating conductive pads as alignment marks at predetermined regions in a component and incorporating conductive pads as reference marks at designated regions on the substrate to match the positions of alignment marks at the component to be placed on the substrate, an alignment chain can be built. The alignment chain is formed by linking the alignment marks at a group of components with the matching reference marks on the substrate over an ACM interconnect layer from component to component to create a serial, continuous conduction path among the group of components to be monitored. Depending upon the complexity of the electronic assembly, the alignment chain may be divided into multiple smaller alignment chains to detect the positional and contact integrity for a smaller group of components linked in a chain by monitoring its conduction status. The technique allows components to be detached for reuse.

In different embodiments of the invention, an electronic assembly may stack multiple substrates into a more compact three-dimensional structure. Interconnection elements can be used to facilitate the interconnection between neighboring substrates in a stacked assembly. The interconnection element comprises a pre-fabricated conductive path or routing trace in a planar structure or package for insertion into a fixture opening or an embossed cavity on the substrate to interconnect neighboring substrates across ACM layers. The interconnection elements can replace expensive socket, mechanical connector, or flexible ribbon circuit with minimal positional constraint on the substrate to simplify the design of an electronic assembly.

The electronic assembly may be sealed in a housing, such as a plastic housing in a flash card, to hold the ACM interfaced components in place. The inner surface of the housing may be molded to match a height profile of the components. The housing may be in a form that can be open for component access, such as a heat spreader used in a memory module. The housing may comprise contacts or openings allowing an alignment chain to be monitored from the housing.

Some exemplary methods of using anisotropic conductive material in an electronic assembly are illustrated. One exemplary method uses a substrate comprising embossed cavities to facilitate the placement of components and an anisotropic conducting membrane at the embossed cavity as a component interconnect layer to the substrate. The ACM may be directly laminated at the component interconnect surface to eliminate the ACM insertion step in manufacturing the electronic assembly. An alternative exemplary method is the use of an aligning fixture in the electronic assembly. The aligning fixture can be aligned to a substrate by using a placement equipment and bonded to the substrate by using anisotropic conductive paste or solder paste, if the fixture also contains an interconnect circuitry. Alternatively, a sheet of ACM may be placed on the substrate surface prior to the placement of the fixture. Both the embossed cavities on the substrate and the openings at the fixture can hold components on the target land patterns at the substrate with accuracy. Alignment marks or alignment mechanism may be incorporated in the fixture to align with matching reference marks or reference mechanisms at the substrate, although an optical pattern recognition technique may be used to align fixture to substrate.

Benefits of exemplary implementations of the invention include the use of the ACM layer to replace solder paste or wire-bonding in a conventional component assembly. By using ACM as a component interconnect layer and using a fixture or embossed cavity at the substrate, components can be readily removed and reattached to an electronic assembly. Components that are expensive or in short supply can be readily detached and reused in different electronic assemblies. Defective components may be easily removed at rework. Furthermore, components can be detached and replaced in a system upgrade. This flexibility results because the ACM layer allows components to be readily detached and reattached in an electronic assembly without necessitating de-soldering or cutting wire-bond that may damage the component or other parts of the assembly.

A better understanding of the nature and advantages of the embodiments of the present invention may be gained with reference to the following detailed description and the accompanying drawings.

DETAILED DESCRIPTION

Figure 1:
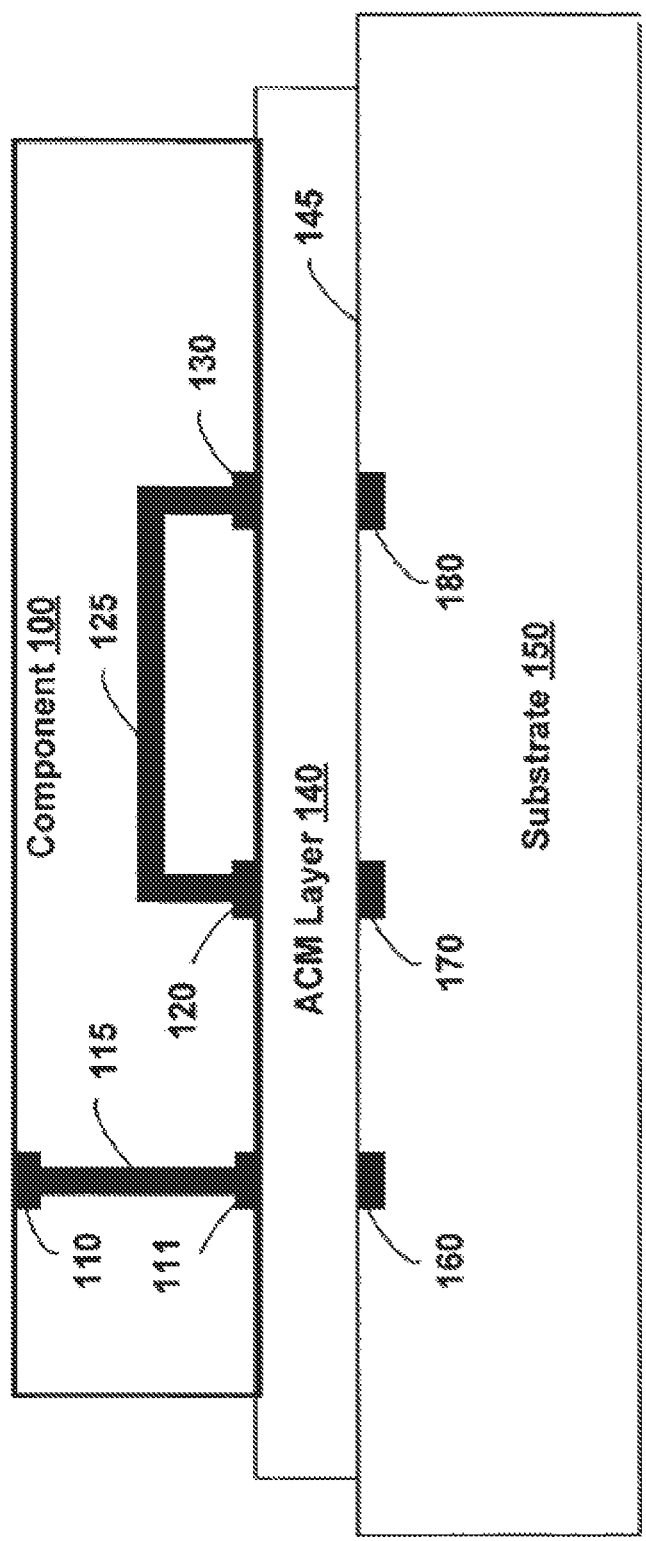
FIG. 1 illustrate a set of alignment marks at a component coupled to a set of reference marks on a substrate with auxiliary conduction pathways, in an exemplary implementation.

Detailed descriptions of exemplary embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ embodiments of the present invention in virtually any appropriately detailed system, structure, or manner.

An exemplary embodiment is an electronic assembly comprising detachable components assembled on a substrate via an anisotropic conductive material as an interconnect layer. The electronic assembly may comprise alignment chains to monitor positional and contact integrity of components on the substrate across the interconnect layer comprising the anisotropic conductive material.

Electronic assemblies, such as flash cards, add-on boards, or memory modules, have components soldered or wire-bonded on substrate, which makes the components difficult to remove or reuse. The anisotropic conductive material can replace solder paste or wire-bonding in conventional electronic assemblies. The anisotropic conductive material conducts electric current in a specific direction and is suitable as an interconnect layer between the components and the substrate. Two forms of anisotropic conductive material can be used in an electronic assembly. One is an anisotropic conducting membrane (ACM), and the other is an anisotropic conductive paste (ACP). The ACM can be attached to, or removed from, a substrate surface. The ACM can also be attached to the component interface surface directly. The ACP is in paste format that can be printed and/or dispensed on an aligning substrate surface. The ACP is typically a material including a conductive filler and binder. As an example, the conductive filler is gold plated resin balls, and the binder is synthetic rubber in a thinner. The binder is capable of bonding two or more articles together using the ACP as an interconnect material after the curing of paste.

It is useful to have electronic assemblies comprised of detachable components. For example, components that are expensive or in short supply can be readily detached from one electronic assembly and reused in a different electronic assembly. Defective components may also be removed easily at rework. Furthermore, a component may also be detached and replaced by a higher performance one in system upgrade. This flexibility results because the ACM layer allows component to be detached without necessitating de-soldering or removing wire-bond that may damage the component or other parts of the electronic assembly.

It is also useful to have a method for monitoring and diagnosing the positional and contact integrity of detachable components in an electronic assembly. One or more alignment chains may be incorporated in the assembly for such a purpose. In exemplary embodiments, an alignment chain is built by incorporating a set of alignment conductive pads, namely alignment marks, at predetermined regions in a component, and a set of matching reference conductive pads, namely reference marks, at designated locations on a substrate for detecting the placement integrity of the component on the substrate, wherein the alignment marks of the component and the matching reference marks on the substrate are linked from component to component in a serial, continuous, conduction path zigzagging between the component and the substrate over the ACM layer for a group of components on the substrate. Depending upon the complexity of the electronic assembly, the alignment chain may be divided into multiple smaller alignment chains to detect positional and contact integrity for a smaller group of components linked in the chain by testing its conduction status.

FIG. 1 illustrates a set of alignment marks in a component and a set of matching reference marks on a substrate with an ACM interconnect layer in between. An alignment mark is a conductive contact region or a conductive pad on the component configured for aligning the component or for monitoring the positional and contact integrity of the component on the substrate. An alignment mark may be at a top surface or a bottom surface of the component. The alignment mark at the top surface of the component is named as a direct alignment mark, and the alignment mark at the bottom surface of the component is named as an indirect alignment mark. The direct alignment mark may be directly accessed for probing while the indirect alignment mark may be indirectly accessed for probing after the component is placed on the substrate. The direct alignment mark may be further connected to the bottom surface of the component through a conduction pathway to be in contact with the ACM layer.

The indirect alignment mark makes a direct contact with the ACM layer. The indirect alignment mark may be connected to other indirect alignment mark through a conduction pathway on the same component. The indirect alignment mark on the component may be indirectly accessible over the ACM layer through a separate conduction pathway connecting to a probing point on a substrate surface beyond the component. The component may be an integrated circuit, a packaged device, a stacked device, a sensor, or an electromechanical element. For the packaged device, the alignment mark may be built in the package without actual connection to a circuit inside the package. For example, for a bare die, the alignment mark can be built in a die scribe line or within a die area.

In FIG. 1, a component 100 comprises a direct alignment mark 110 and two indirect alignment marks 120 and 130. In exemplary embodiments, the direct alignment mark 110 may be in contact with an ACM layer 140 at a contact region 111 through a conduction pathway 115. The two indirect alignment marks 120 and 130, both in contact with the ACM layer 140, are connected together through a conduction pathway 125. The conduction pathways 115 and 125 and the alignment marks 110, 120, and 130 illustrated in FIG. 1 are examples and are not to be construed as an exhaustive list of possible alignment marks and conductive pathways.

FIG. 1 also illustrates a coupling between the component 100 and a substrate 150 through the ACM layer 140. A substrate surface 145 comprises reference marks 160, 170, and 180. A reference mark is a conductive pad or a contact region on the substrate surface 145 configured to align with a corresponding alignment mark on the component 100. In exemplary embodiments, spatial locations for a set of reference marks (e.g., 160, 170 and 180) to a land pattern on the substrate 150 should match the spatial locations of a set of alignment marks (e.g., 110, 120 and 130) to a contact array on the component 100. As a result, aligning the set of alignment marks (e.g., 110, 120 and 130) at the component to the set of reference marks (e.g., 110, 170 and 180) on the substrate can detect if the contact array at the component 100 is accurately and properly positioned on the land pattern at substrate 150 after the component 100 is placed. In FIG. 1, the reference mark 160 is configured to align with the alignment mark 110, the reference mark 170 is configured to align with the alignment mark 120, and the reference mark 180 is configured to align with the alignment mark 130. The reference marks illustrated in FIG. 1 are examples and are not to be construed as an exhaustive list of possible reference marks.

Figure 2:
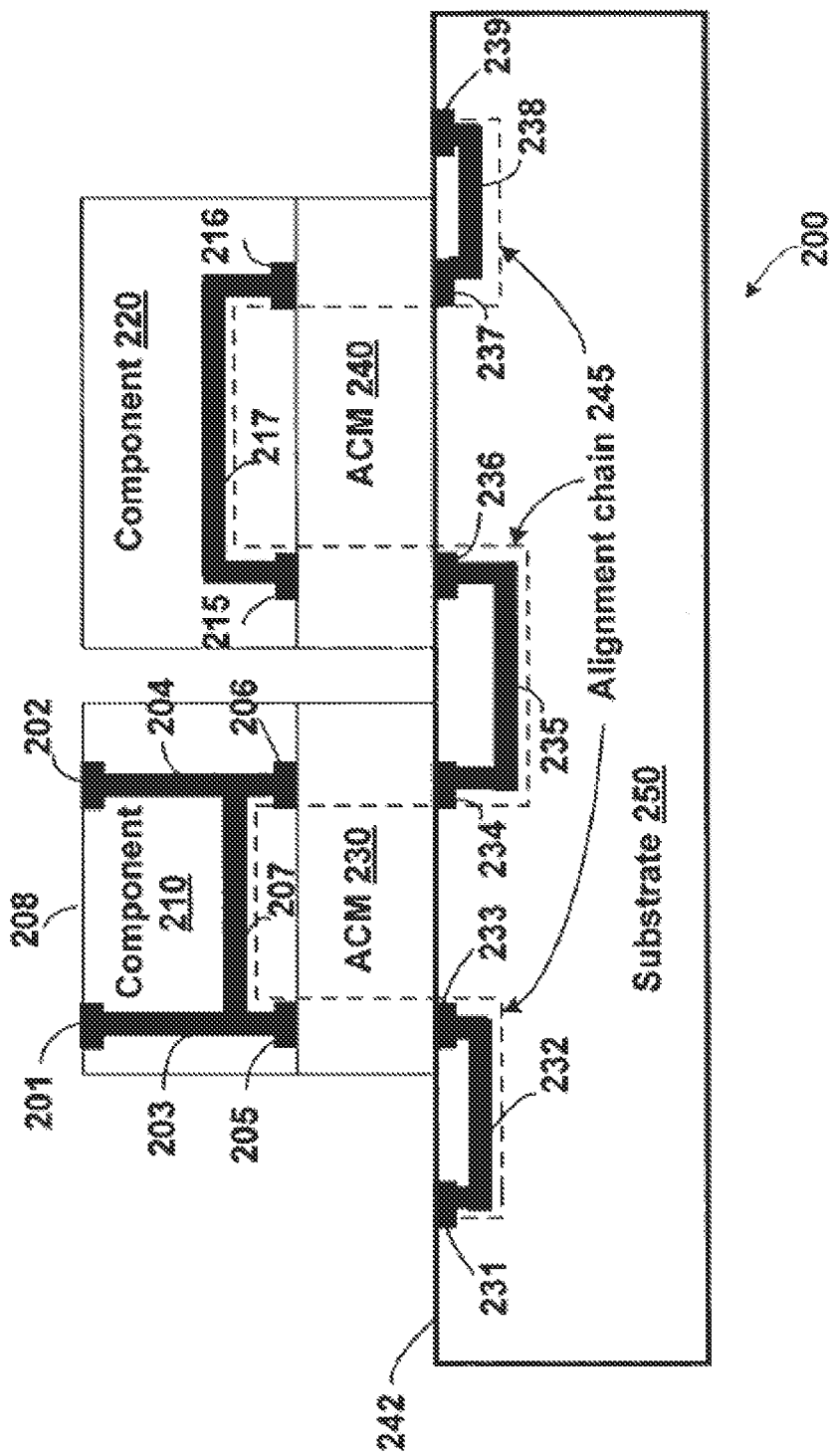
FIG. 2 depicts an exemplary implementation of an alignment chain linking two components on a substrate using anisotropic conducting membrane as an interconnect layer.

FIG. 2 depicts an exemplary diagram of an electronic assembly 200 including an alignment chain. Two components 210 and 220, two ACM layers 230 and 240, a substrate 250, and an alignment chain 245 are shown in an exemplary implementation. The components 210 and 220 are coupled to the substrate 250 via the ACM layers 230 and 240, respectively. The component 210 comprises two direct alignment marks 201 and 202 at a top surface, which are further connected by way of two conduction pathways 203 and 204 to make contact with the ACM layer 230 at bottom contact pads 205 and 206 of the component 210. Through the ACM layers 230, the alignment marks 201 and 202 are able to make contact with reference marks 233 and 234 at a substrate surface 242 if the component 210 is aligned on the substrate 250 correctly. The conduction pathways 203 and 204 allow the placement and contact condition of the component 210 on the substrate 250 to be probed from a component top surface 208. A conduction pathway 207 links the bottom contact points 205 and 206 associated with the alignment marks 201 and 202 to form part of the alignment chain 245 at the component 210.

The component 220 comprises two indirect alignment marks 215 and 216 at a bottom surface. In exemplary embodiments, the indirect alignment marks 215 and 215 are inaccessible from a top of the component 220. A conduction pathway 217 links the two indirect alignment marks 215 and 216 to become part of the alignment chain 245. To access the indirect alignment mark 216 at the component 220 over the ACM layer 240, a conduction pathway 238 is incorporated at the substrate 250 with one end-point connecting to a reference mark 237 at the substrate surface 242 and the other end-point connecting to a probing region 239 also at a substrate surface 242. To access the indirect alignment mark 215 over the ACM layer 240, a conduction pathway 235 is incorporated at the substrate 250 where one end-point is connected to a reference mark 236 and the other end-point is connected to a reference mark 234 to become part of the alignment chain 245. The indirect alignment marks are useful in the alignment chain formation.

The ACM layer 230 and 240 is configured to replace solder paste or wire bond in the electronic assembly 200. The ACM layer 230 and 240 conducts current in a specific direction, which is vertical in this case. The ACM layer 230 and 230 electrically interconnects component 210, 220 to substrate 250 but without conducting electrical current to neighboring regions within the ACM layer. The ACM layer enables component to be readily attached and detached from the substrate surface.

Reference marks 231, 233, 234, 236, 237, and 239 are prefabricated on the substrate surface 242, where the reference marks 233 and 234 are for the placement of the component 210, the reference marks 236 and 237 are for the placement of the component 220, and the reference marks 231 and 239 are for probing the integrity of the alignment chain 245.

As the components 210 and 220 are properly aligned on the substrate 250 through the ACM layers 230 and 240, a continuous alignment chain 245 is formed in a serial, continuous, conductive path zigzagging between the components 210 and 220 and the substrate 250 across the ACM layers 230 and 240. The alignment chain 245 originates from a probing point (e.g., reference mark 231) at the substrate 250, through a conduction pathway 232 linking to the reference mark 233, then across the ACM layer 230 to the matching bottom surface contact-point 205 at the component 210, then through a conduction pathway 207 at the component 210 to a different surface contact point 206, then across the ACM layer 230 again back to the substrate 250 connecting to the reference mark 234, through a conduction pathway 235 continuing to the reference mark 236 devised for the second component 220, then over the ACM layer 240 coupling to the indirect alignment mark 215 at the component 220, through a conduction pathway 217 at the component 220 to the indirect alignment mark 216 on the same component 220, over the ACM layer 240 again back to the substrate 250 at the reference mark 237, where it is coupled to the end probing point 239 associated with the aligning chain 245 through a conduction pathway 238 at the substrate 250. The conduction pathways 232, 235, and 238 may be embedded in the substrate 250 or fabricated at the substrate surface 242. In case the component 210 or 220 is deviated from its target position at the substrate 250, or there is a poor contact condition between the component 210 or 220 and the substrate 250, the alignment mark at component 210 or 220 will no longer be in line with, or in contact with, its corresponding reference mark at the substrate 250. No conduction status will be detected from the end points (e.g., 231 or 239) of the alignment chain.

The conduction pathways 232 and 238 appended to the end of alignment chain 245 provide access points 231 and 239 for testing the integrity of the alignment chain 245 in the assembly 200. In various exemplary embodiments, a ground or power connection may be inserted in the alignment chain 245 to split it into two separate, shorter alignment chains. The connection to ground or power creates a new end point for the split alignment chain. Components in an assembly can also be divided into several sub-groups to form several alignment chains. Multiple alignment chains are more effective in localizing displaced components in the assembly because a smaller alignment chain may encompass a smaller number of components in a localized area in an electronic assembly. Multiple test points can also be inserted to a large alignment chain along the conduction pathway or at the component to monitor the conduction status between any two test points.

Passive components, such as resistors, capacitors, inductors, and other small outlined devices, which are typically low in cost or small in physical dimension, may be embedded in the substrate 250 during the substrate fabrication (e.g., as embedded capacitors and embedded resistors) or soldered at the substrate surface 242 in the electronic assembly manufacturing.

An enclosure or protective structure, such as a plastic housing or a heat spreader, may be used to hold the ACM interfaced components in place in an electronic assembly. With the inclusion of the alignment chain in the assembly, the positional and contact status of the components enclosed in the protective structure, which may not be accessible from outside, can be monitored and detected through an alignment chain. Besides directly measuring the conduction status of the alignment chain by applying voltage source and ground to the end points of alignment chain respectively, various methods can be used to monitor the placement integrity of components at the alignment chain. For example, if a sensing device is attached to a connection point in the alignment chain, which may be on the substrate surface or may be incorporated at the component, then the positional and contact integrity for the group of components along the alignment chain can be detected easily by monitoring the status in the sensing device. As an example, the sensing device may be a latch in a component with a connection to an alignment mark accessible by the component. By applying a signal from one end-point of the alignment chain and monitoring the status of the sensing device at the component, the integrity of alignment chain from the one end-point to the component comprising the sensing device can be readily determined. By toggling the signal applied to an end-point of the alignment chain, the sensing device or latch at the component along the alignment chain can be monitored to determine whether or not it toggles accordingly. If not, a bad contact or displaced component along the alignment chain in an electronic assembly is thus identified.

Figure 3:
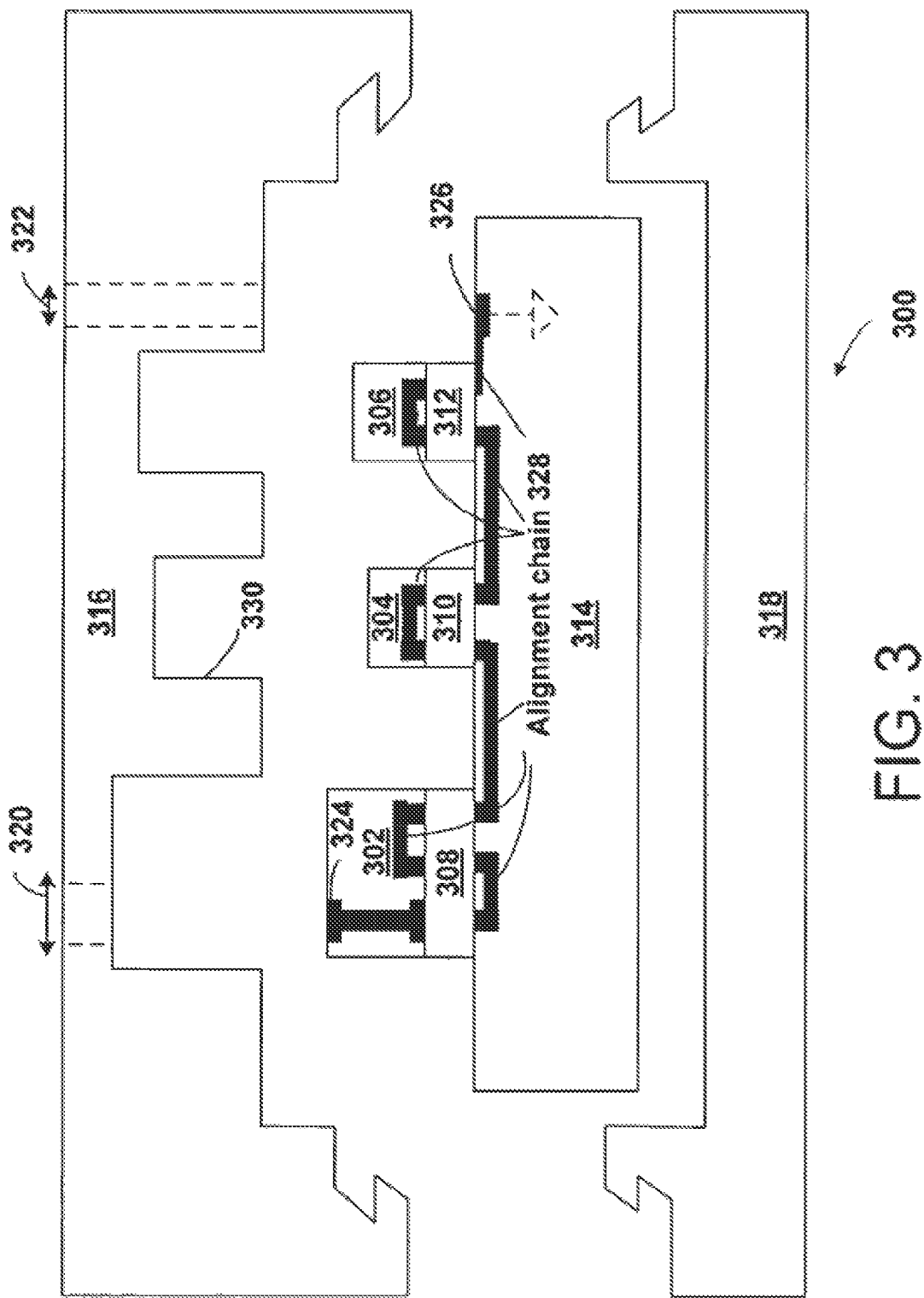
FIG. 3 is depicts an enclosed electronic assembly comprising an alignment chain, in an exemplary implementation of the invention.

FIG. 3 depicts a diagram showing an exemplary implementation of the invention, which comprises a solder-free electronic assembly in an enclosure with a built-in alignment chain. The example illustrates a set of components 302, 304, and 306, connected to a substrate 314 through ACM layers 308, 310, and 312, housed in a protective covers 316 and 318 in an electronic assembly 300. Openings 320 and 322 at the top cover 316 may be provided for accessing the probing points (e.g., alignment mark 324 and contact point 326) of an alignment chain 328 to observe positional and contact integrity for the set of components 302, 304, and 306 on the substrate 314. The alignment chain 328 in the assembly 300 originates at the alignment mark 324 of the component 302, zigzags through the ACM layer 308, the substrate 314, and the ACM layer 308 again to the component 302, then through the ACM layer 308 again back to the substrate 314. The alignment chain 328 continues to the component 304 through the ACM layer 310, through the component 304 and through the ACM layer 310 again back to the substrate 314, then through ACM layer 312 to the component 306, back to the substrate 314 through the ACM layer 312 and ends at the contact point 326. One end point of the alignment chain 328 (e.g., contact point 326) may be coupled to ground, shown in dotted line to simplify diagnosis connection. In this case, the opening 322 at the top cover 316 is not required. One opening at the top cover matching a location of the other end-point is sufficient. The opening at the top cover 316 for accessing the end-point of the alignment chain 328 may be replaced by a built-in conduction pathway within the cover 316 if a proper contact can be insured, such as applying an ACM layer in between. In an alternative approach, no opening in the cover is required if the end points of the alignment chain are accessible from the external interface pads of the electronic assembly (e.g. by multiplexing the end points of alignment chain with the functional pins of the electronic assembly).

FIG. 3 also shows a set of matching notches being incorporated at an edge of the top and bottom covers 316 and 318 to hold the assembly in place when the covers 316 and 318 are clipped on. An inner surface 330 of the top cover 316 may be embossed in a topology with thickness variations matching the height variations of components 302, 304, and 306 in the assembly 300 to hold the components 302, 304, and 306 in place. Elasticity of the ACM layer 308, 310, and 312 may provide contact pressure after the clipping of the covers 316 and 318. Although FIG. 3 only shows one side of the substrate 314 assembled with the components 302, 304, and 306, it is applicable to an electronic assembly having both sides of the substrate 314 populated with components.

In various embodiments of the invention, to facilitate the placement of components on a substrate and to hold components in place in an electronic assembly with ACM as an interconnection layer, a positional fixture comprising prefabricated openings to match physical outlines of the components to be placed on the substrate may be included in the assembly. A set of alignment marks may be comprised within the fixture to align with a set of reference marks on the substrate so that a contact array at a component can be placed accurately on a target land pattern at the substrate if the set of alignment marks at the fixture is properly aligned to the set of reference marks on the substrate. The fixture can be attached, clipped, or glued on the substrate surface, according to exemplary embodiments, after it is properly aligned to the substrate.

In yet another embodiment of the invention, the set of openings at the fixture may be directly embossed at the substrate surface during substrate fabrication to become a set of embossed cavities on the substrate. Nevertheless, an inserted fixture is more adaptive than an embossed one. For example, the physical outline of many comparable memory chips, such as gigabit DRAM or Flash, may be varied from semiconductor company to company due to variations in the IC fabrication process. A more advanced process can yield a packaged chip in a smaller physical outline. However, pin location and pin pitch associated with the contact array of comparable memory chips are mostly the same to ensure interchangeability in manufacturing. An inserted fixture is more adaptive than the embossed one to meet manufacturing needs.

Figure 4A:
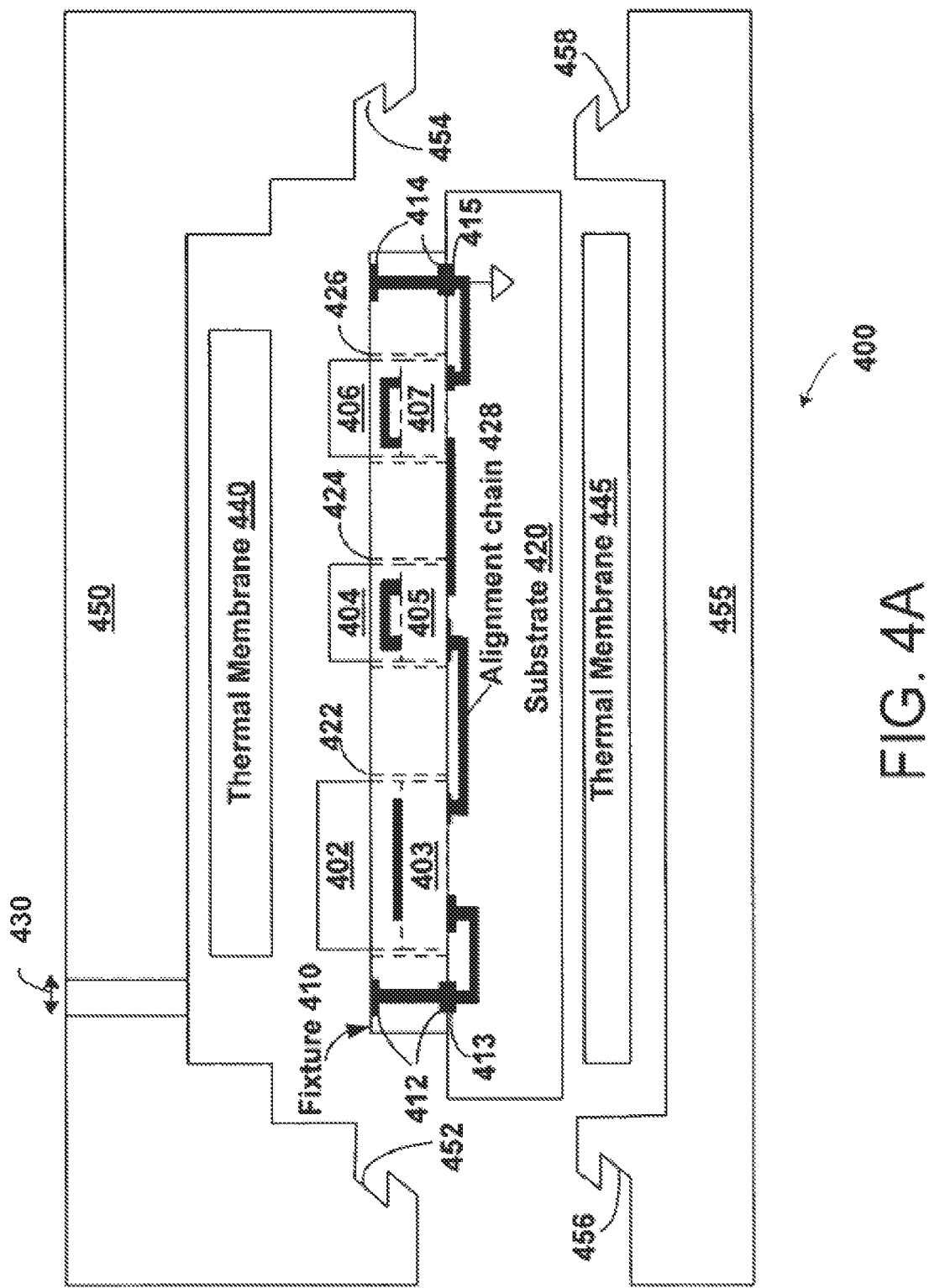
FIG. 4A depicts a profile of an exemplary electronic assembly using a fixture to assemble components on a substrate enclosed in a housing.

FIG. 4A illustrates a profile view of an exemplary implementation of the invention using a fixture 410 for assembling a set of components 402, 404, and 406 onto a substrate 420 in an electronic assembly 400 enclosed in covers 450 and 455. The fixture 410 comprises openings 422, 424, and 426 matching physical outlines of the components 402, 404, and 406, respectively. The openings 422, 424, and 426 are pre-fabricated at specific positions so that the components 402, 404, and 406 along with ACM 403, 405, and 407 as interconnect layers can be placed accurately on corresponding land patterns at a substrate surface. A set of alignment marks 412 and 414 are incorporated at the fixture 410 with matching reference marks 413 and 415 at the substrate surface for aligning the fixture 410 to the substrate 420. The fixture 410 is aligned to the substrate 420 by aligning the alignment marks 412 and 414 to the matching reference marks 413 and 415. The components 402, 404, and 406 may then be placed at the openings 422, 424, and 426. The aligned fixture 410 is able to hold components 402, 404, and 406 accurately on the corresponding target land patterns at the substrate surface.

The thickness of the fixture 410 is comparable to a lowest component height. Inner surfaces of the covers 450 and 455 may be embossed in a topology matching a height variation of the components 402, 404, and 406 to be assembled. Alternatively, a layer of thermal membrane 440 and 445 may be inserted between the components 402, 404, and 406 and the covers 450 and 455 if the thermal membrane 440 and 445 is thick enough to serve as a buffer to press the ACM interfaced components in place. The thermal membrane 440 and 445 may also transfer heat generated by the components 402, 404, and 406 to the cover surface.

Various approaches can be used to align the fixture 410 to the substrate 420. For example, the fixture 410 can be aligned to the substrate 420 mechanically by incorporating a set of mounting holes as mechanic alignment marks at the fixture 410 and a set of mounting cylinders as a mechanical reference marks at the substrate 420, or vice versus with mounting cylinders at the fixture 410 and mounting holes at the substrate 420. According to some embodiments, the aligned fixture 410 is adhered to the substrate surface with paste, glue, a clamp, or a screw after the fixture 410 is aligned to the substrate 420. The final assembly is then enclosed in a housing comprising a set of covers 450 and 455. The covers 450 and 455 may comprise one or more contact openings 430 or contact pads for external interfacing use or for monitoring the contact status of an alignment chain 428.

In FIG. 4A, top notches 452 and 454 on the top cover 450 are configured to couple with bottom notches 456 and 458 on the bottom cover 455 to hold the electronic assembly 400 securely after the covers 450 and 455 are pressed together. The top notches 452 and, 454 and the bottom notches 456 and 458 may be two parallel slits along an edge of the covers 450 and 455. The shapes of the notches depicted in FIG. 4A are intended as illustrative and are not to be construed as the only possible shape of the notches or the only possible way of sealing. For example, the top cover 450 and the bottom cover 455 may be sealed by using ultrasonic welding technique or by using clips if there are no notches or matching slits to hold the covers 450 and 455 together. The assembly technique shown in FIG. 4A is applicable to flash card assembly, memory card assembly, and consumer electronic product assembly in various embodiments.

Figure 4B:
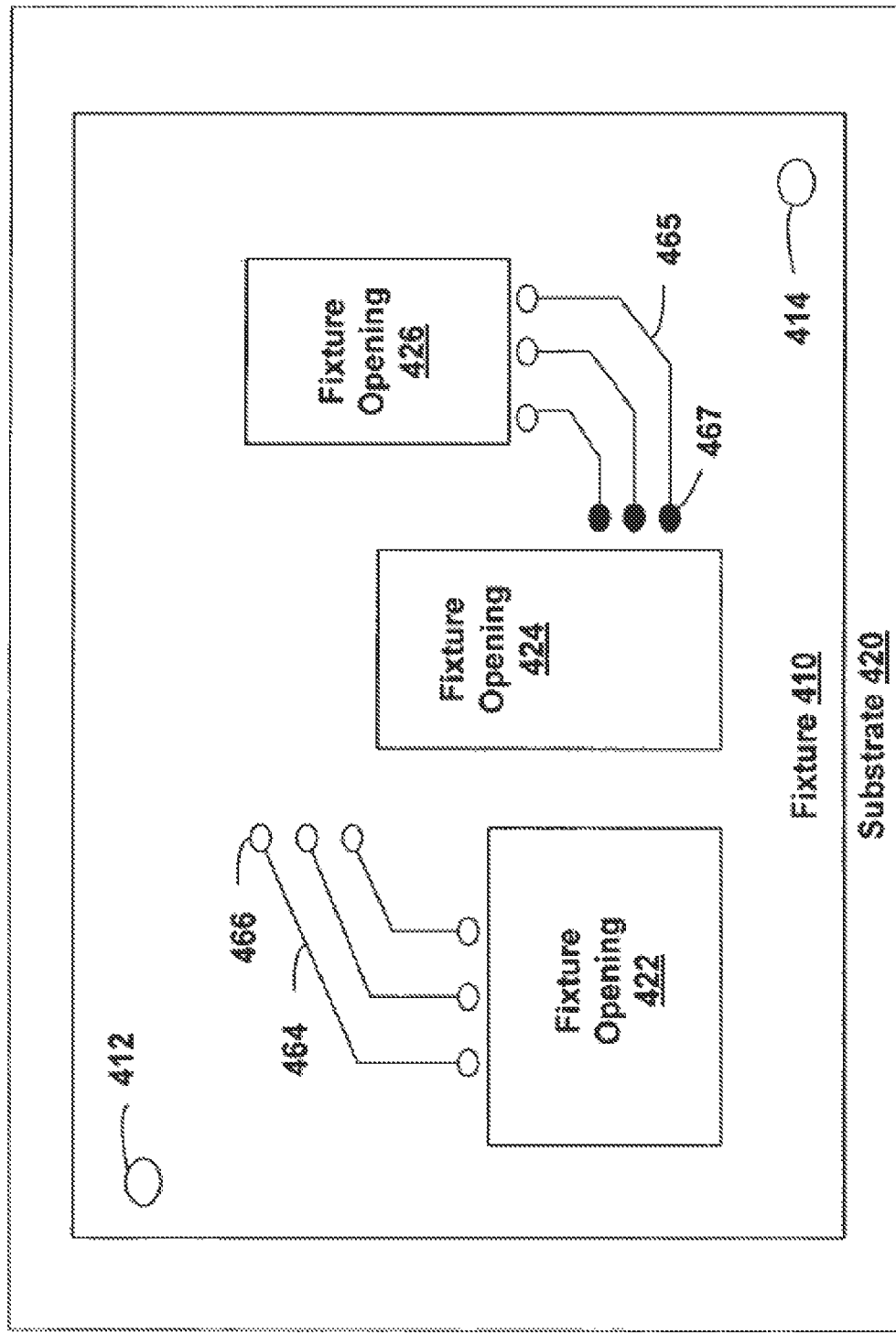
FIG. 4B depicts a top view of an exemplary fixture comprising interconnection traces and coupled to a substrate underneath.

FIG. 4B depicts a top view of the fixture 410 placed on the substrate 420. Another embodiment of the invention is the incorporation of interconnect circuitries at the fixture 410 so that the fixture 410 not only serves as a position holder for the ACM interfaced components but also comprises interconnect circuitries for the components in the electronic assembly. Passive components can also be pre-fabricated, incorporated, or embedded within the fixture 410. FIG. 4B illustrates exemplary interconnection traces 464 and 465, via 466, and conductive pads 467 for external access embedded in the fixture 410. The interconnect traces 464 and 465 at the fixture 410 and the interconnect traces at the substrate 420 comprise a complete set of interconnect circuitry for the electronic assembly through the ACM layer underneath the fixture 410. The fixture 410 may be a single-layer fixture or a multiple-layer fixture comprising more interconnection layers for a higher routing density and a better signal integrity.

The alignment chain in an electronic assembly can incorporate the fixture as part of the alignment chain by adding conduction alignment marks and conductive pathways to the fixture and linking these marks and pathways with the alignment marks and conductive pathway at the components, and the matching reference marks and conduction pathways at the substrate into a serial continuous conduction path to detect the positional and contact status of the components and the fixture on the substrate. One or more end points of the alignment chain can be made accessible outside the cover to detect the integrity of the alignment chain.

In an assembly process, the ACM layer can be coupled to the component using one of several techniques. For example, the ACM layer can be attached to a surface of a packaged device, a bare die IC, or a stacked device prior to being placed in the assembly. Alternatively, a pre-carved ACM layer can be inserted into an opening at the fixture embossed or already attached to the substrate surface prior to the placement of the components. In yet another embodiment, an ACM layer is placed on the substrate surface prior to the placement of the fixture on the substrate, after which the components are placed on the substrate using the fixture as a guide.

When ACP is used in the manufacturing processes, a thin layer of ACP is dispensed or printed on the substrate surface. Components are directly aligned and placed on the land patterns at the substrate surface without the use of the fixture. A plate or cover may be used to hold the aligned components in place, follows a curing and heat pressing process to attach the components securely onto the substrate.

In another embodiment of the invention, an ACM and ACP combined technique can be used in the electronic assembly, in which ACP is used to bind the fixture onto the substrate, and ACM is used as the component interconnect layer. A component using ACM as the interconnect layer can achieve good contact and can be easily detached from the substrate surface for reuse.

In various exemplary embodiments of the invention, two or more fixtures can be used in an electronic assembly to ease assembly and rework process. For example, a first fixture can be configured to align and hold a first subgroup of components, and a second fixture can be configured to align and hold a second subgroup of components (e.g., the remaining components). Some exemplary embodiments comprise an electronic assembly in which components are placed on both surfaces of the substrate. In such embodiments, one or more fixtures can be used to align and hold the components coupled to the first substrate surface and one or more additional fixtures can be used to align and hold the components coupled to the second substrate surface. Multiple fixtures are useful in a large electronic assembly to cope with thermal expansion deviation between the fixture and the substrate, if any, and to ease the rework.

Figure 5:
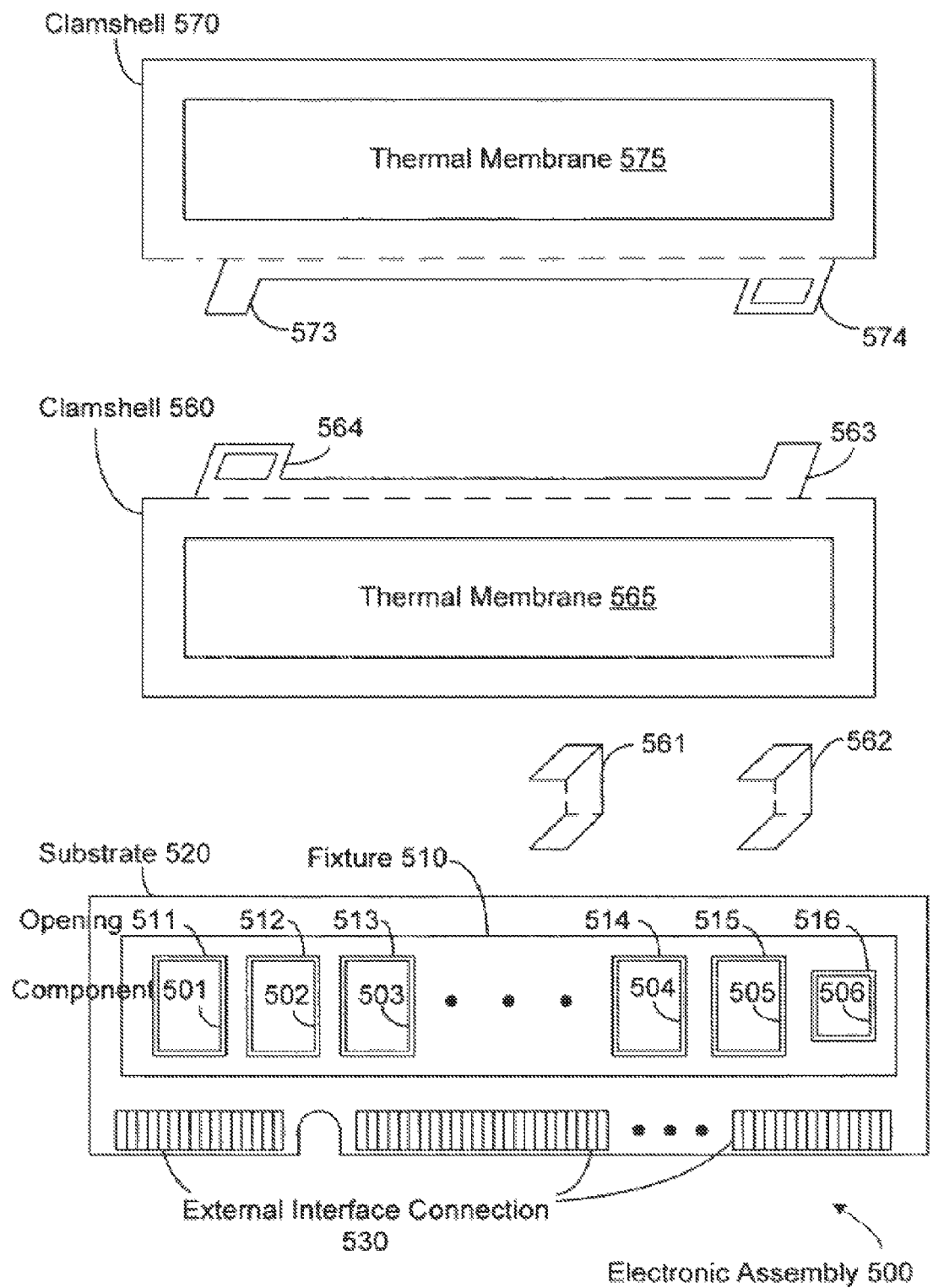
FIG. 5 depicts an exemplary electronic assembly of a memory module, where a fixture is attached to a substrate to hold the ACM interfaced components in place enclosed in a housing.

FIG. 5 depicts an exemplary assembly of the invention, such as a memory module or an add-on board, where a fixture 510 is attached to a substrate 520 to hold ACM interfaced components 501, 502, 503, 504, 505, and 506 in an electronic assembly 500 surrounded by protective housing, such as a pair of clamshells 560 and 570. In this embodiment of invention, the fixture 510 may be embossed on the substrate surface to become a plurality of embossed openings on the substrate, or the fixture 510 may be coupled to the substrate 520 during the assembly process. The protective housing, for example, may be a heat spreader comprising the two identical clamshells 560 and 570 and two identical clamps 561 and 562. Along a long edge of the clamshells 560 and 570 there is a male notch 563 and 573 and a female notch 564 and 574 being bent at a right angle toward an inner surface of the clamshells 560 and 570. In alternative embodiments, the clamps 561 and 562, male notches 563 and 573, and female notches 564 and 574 may not need to be identical.

During assembly, the components 501, 502, 503, 504, 505, and 506 are placed at openings 511, 512, 513, 514, 515, and 516 of the fixture 510 after the fixture 510 is aligned and attached to the substrate 520. Then the assembled substrate containing fixture 510 and components 501, 502, 503, 504, 505, and 506 is placed on the inner surface of one clamshell (e.g., 560). Taking the second clamshell (e.g., 570) and rotating it by 180 degree so that its male notch 573 and female notch 574 are able to be inserted into the mating female notch 564 and male notch 563 of the first clamshell 560. Flipping and closing the two clamshells 560 and 570, the assembled substrate can be sandwiched between two inner surfaces of the clamshells 560 and 570. Attaching the clamps 561 and 562 to a top edge of the closed clamshells 560 and 570, the ACM based components 501, 502, 503, 504, 505, and 506 can be held steady inside the fixture openings 511, 512, 513, 514, 515, and 516 in the electronic assembly 500. Thermal membranes 565 and 575 may be attached to the inner surface of the clamshells 560 and 570. The elasticity of the thermal membranes 565 and 575 is able to press components in good contact with the substrate 520. The thermal membrane 565 and 575 is adaptive to a minor height variation among components 501, 502, 503, 504, 505, and 506 on the substrate 520, if any. The contact integrity of the ACM interconnected components 501, 502, 503, 504, 505, and 506 on the substrate 520 in an enclosed assembly can be monitored with one or more alignment chains linking components in a serial connection with access points either incorporated from the surface of the clamshell 560 or 570, or connected to an external interface connection 530 or an exposed substrate surface.

Figure 6:
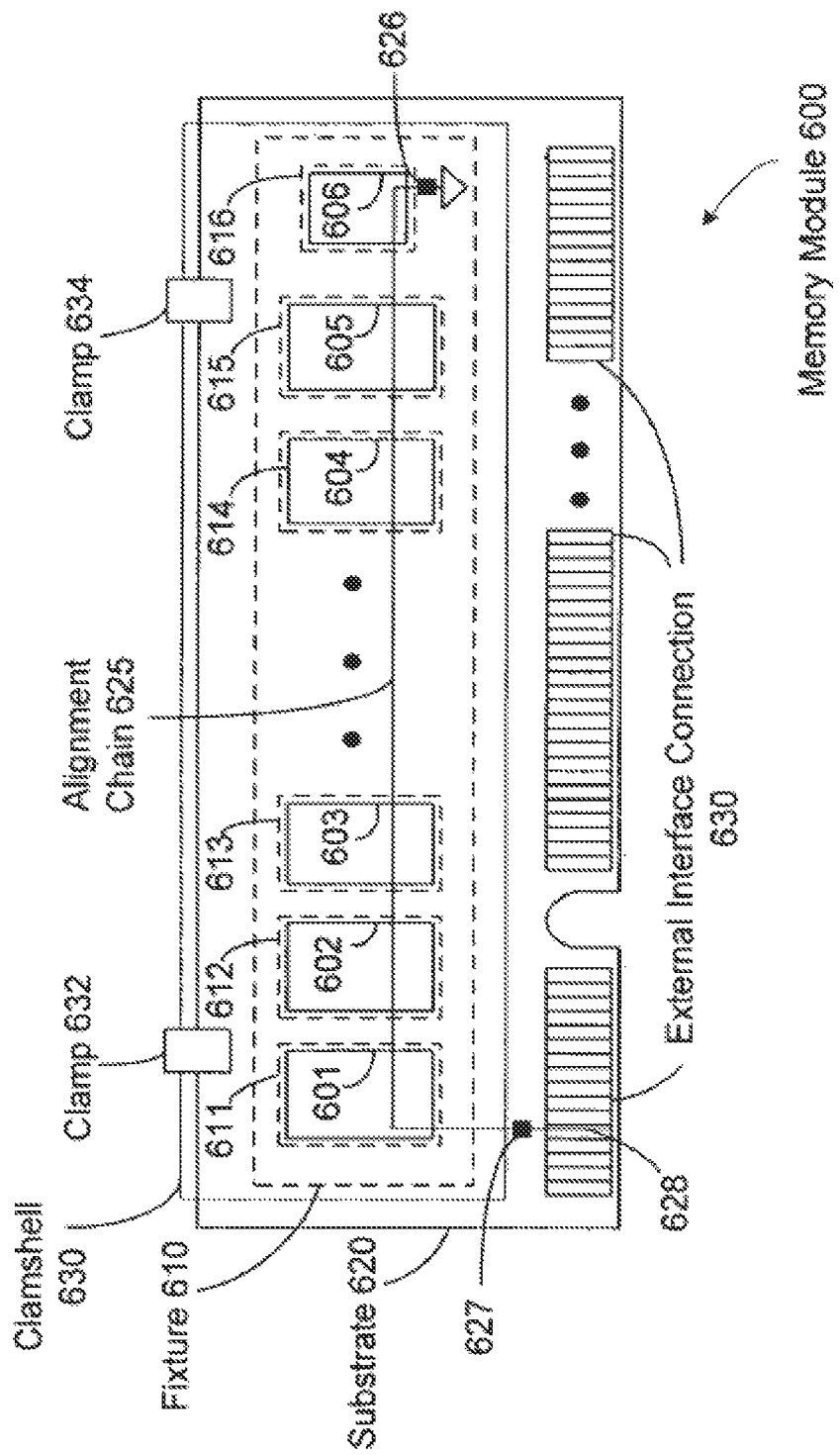
FIG. 6 depicts a top view of a memory module including a fixture, components, an alignment chain, and an external interface enclosed in a clamshell according to an exemplary implementation of the invention.

FIG. 6 depicts a top view of an exemplary memory module 600 comprising elements similar to those of FIG. 5. The memory module 600 is housed in a clamshells 630. The clamshell 630 functions as a protective device, a component retaining device, and a heat dissipation device for a group of components assembled in the memory module 600. In the exemplary illustration, the memory module 600 comprises a fixture 610 on a PCB substrate 620. One or more fixtures 610 may be attached to a surface of the PCB substrate 620 to support a one or two sided PCB assembly. Memory components or devices 601, 602, 603, 604, and 605 and supporting logic device 606, such as clock chip, register chip, buffer chip, or an integration of these logic functions, using ACM as an interconnect layer over the PCB substrate 620, are then placed at the openings 611, 612, 613, 614, 615, and 616 of the fixture 610 and retained by a set of clamshell 630 housing with clamps 632 and 634 clipped on a top edge of the clamshell 630. The clamps 632 and 634 are configured to couple with the clamshell 630 to hold the memory assembly tightly within the clamshell 630. Although only one supporting logic device 606 is shown, a memory module may include more than one supporting logic devices. In exemplary embodiments, the memory device may comprise a dynamic random access memory device, static random access memory device, flash memory device, electric erasable programmable memory device, programmable logic device, ferromagnetic memory devices, or any combination of the above.

In the exemplary illustration, an alignment chain 625 links the memory components and the supporting logic devices for checking contact integrity of the memory components and logic devices along the alignment chain 625 in the memory module 600, where one end-point 626 of the alignment chain 625 may be tied to ground and another end-point 627 is accessible from a substrate surface, according to one embodiment. The end-point 627 may be further coupled to a pin 628 at an external interface region 630 (i.e., gold finger) to be directly accessible by a motherboard or main-board after the memory module 600 is inserted into a socket in the motherboard. In another embodiment, both end points 626 and 627 of the alignment chain 625 may be connected to the pins at the external interface region 630 of the memory module 600 accessible by a motherboard or for further coupling to other alignment chains in the motherboard. Sensing device, such as latch, can be attached to the component along the alignment chain to monitor the integrity of the alignment chain. The alignment chain 625 is an optional feature in the memory module 600 implementation using ACM as the component interconnect layer.

Figure 7:
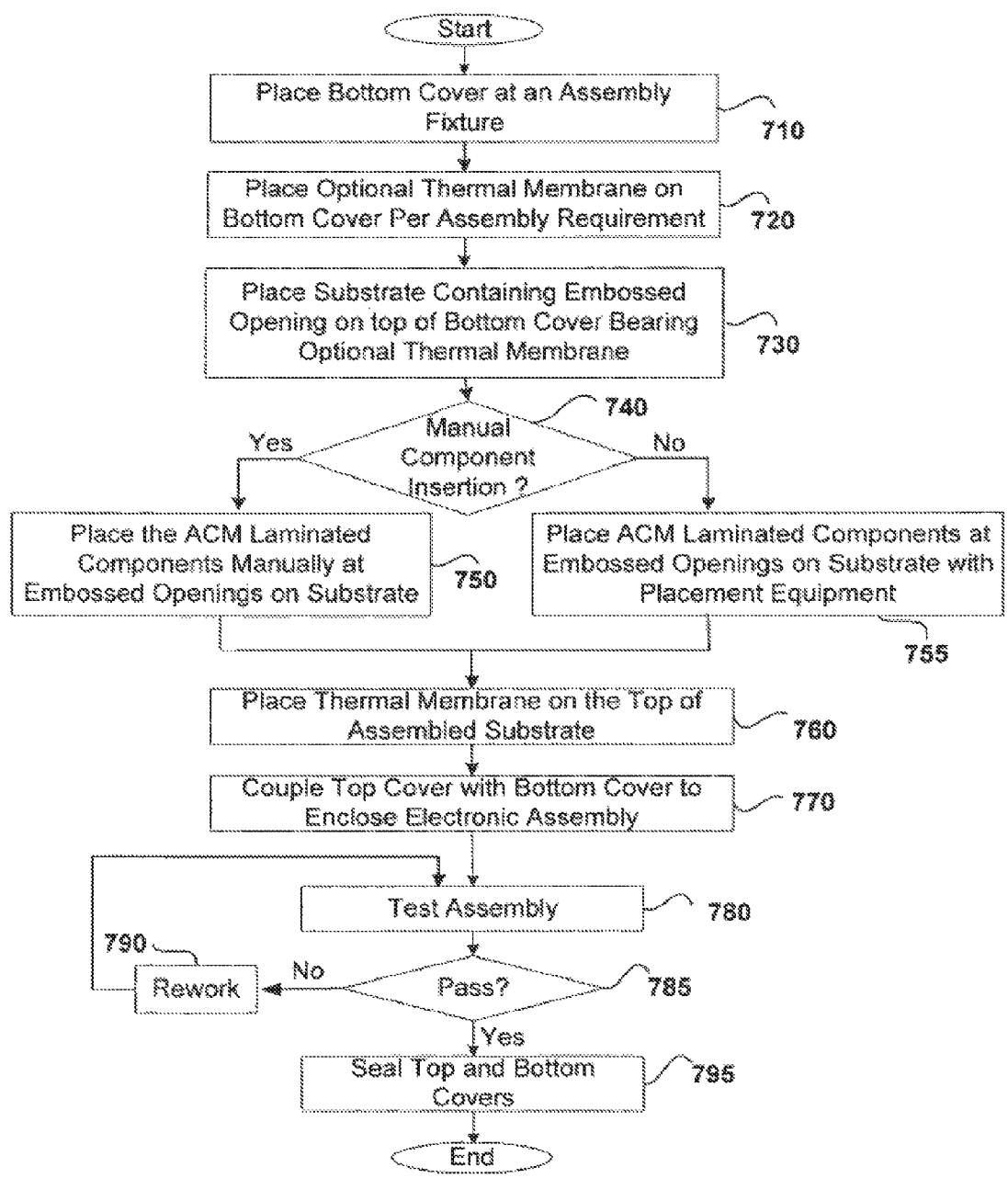
FIG. 7 depicts a flowchart of an exemplary method for assembling ACM laminated components on a substrate embossed with placement cavities in an exemplary assembly enclosed in a housing.

FIG. 7 depicts a flowchart of an exemplary method for assembling an exemplary electronic assembly enclosed in a housing. The electronic assembly is similar to the assembly 400 in FIG. 4A with a number of simplifications. For example, in the exemplary flowchart a substrate surface is embossed with cavities for guiding placement of components, instead of using a fixture. In addition, an ACM layer is laminated at a component surface, instead of using a separate ACM layer placed between the component and the substrate. The cavities embossed on the substrate surface can have accuracy compatible to PCB fabrication process in a range of a few mils, where a mil is a thousandth of an inch. In addition, only one side of the substrate is assembled with components in the exemplary embodiment of FIG. 7, although both sides of the substrate can be assembled with components. To improve manufacturing quality and throughput, an assembly fixture may be used in a surface mount equipment to facilitate assembly of multiple electronic assemblies at a time.

FIG. 7 begins in step 710, in which a housing cover (e.g., a bottom cover) is placed in an assembly fixture. It should be noted that only one electronic assembly is discussed in FIG. 7 since the same procedure can be repeated several times if more than one electronic assembly is to be assembled in parallel.

After the bottom cover is placed in an assembly fixture, a thermal membrane may be placed over the bottom cover in step 720. The thermal membrane is an optional bill of material, depending upon heat generation and requirements of mechanical supports in the final electronic assembly. In step 730, a substrate comprising embossed cavities is placed on the bottom cover including the optional thermal membrane. Then depending upon the assembly method in step 740, ACM laminated components can be inserted at embossed openings manually in step 750, or with placement equipment in step 755. After the component placement, a thermal membrane or elastic laminar may then be placed on the assembled substrate in step 760 to improve thermal dissipation and to press the ACM laminated components to make good contact with the substrate after placing a top cover to temporarily enclose the assembly in step 770. Alternatively, a thermal membrane or elastic material may be pre-laminated at the inner surface of the cover to eliminate steps 720 and 760 in the assembly method.

After the top cover is positioned to temporarily enclose the electronic assembly, testing is conducted in step 780 to determine whether or not the assembly is properly assembled. If it is not properly assembled as determined in step 785, then a rework is carried out in step 790 to remove the top cover and to diagnose misplaced components or poor contact components to fix the problem. The top cover is then replaced and the assembly is retested in step 780. If the assembly passes the test, then the housing is securely sealed, such as by applying ultrasonic welding to seal top and bottom covers, to form the electronic assembly.

Figure 8:
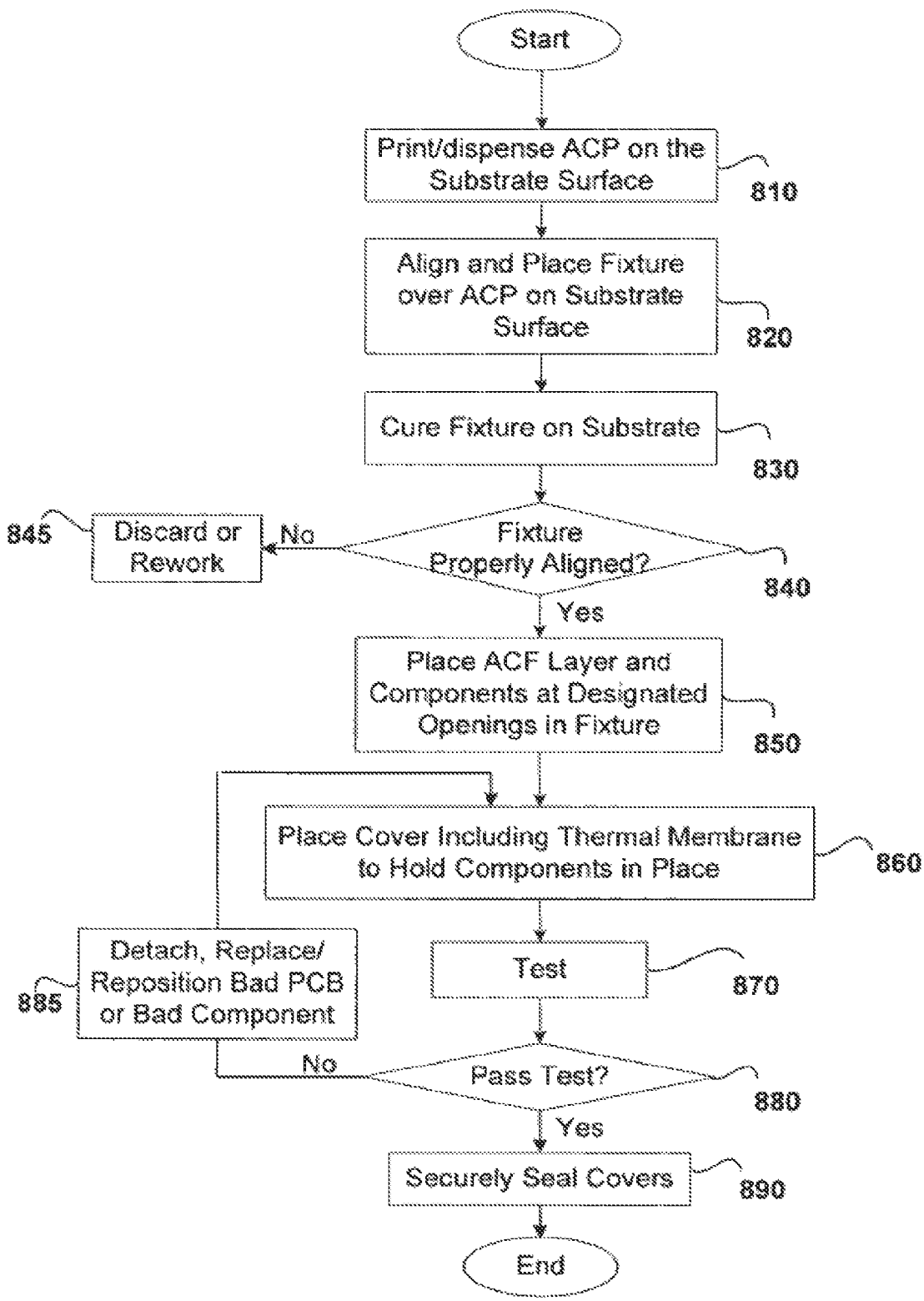
FIG. 8 depicts a flowchart of an exemplary method for assembling an electronic assembly using ACP and ACM combined techniques.

FIG. 8 is a flowchart depicting an exemplary method for assembling an electronic assembly using an ACP and ACM combined technique, where ACP is used to bind a fixture (namely a component fixture) on a substrate surface, and ACM is used as an interconnect layer between components and a substrate so that the components can be readily inserted or detached from a substrate surface without use of solder paste as in conventional assemblies. The substrate is electronically coupled or interconnected to the components via the ACM layer and to the component fixture via the ACP layer. Serial alignment chains can be embedded in the assembly to monitor positional and contact integrity of the components. Similar to the embodiment in FIG. 7, a number of electronic assemblies can be assembled in parallel under pick-and-place surface mount equipment. To simplify depiction, only one electronic assembly is discussed in the method of FIG. 8.

At the beginning of assembly, an ACP layer is dispensed or printed on the substrate surface with a paste pattern specific for the component fixture to be placed in step 810. Conduction traces can be fabricated at the component fixture as part of interconnection circuitry in the electronic assembly.

The component fixture is aligned and placed on the substrate surface dispensed with a layer of ACP in step 820. The ACP should be thick enough to bind the component fixture securely on the substrate surface after curing of paste. The component fixture may be aligned to the substrate surface by aligning a set of alignment marks on the fixture to a set of target reference marks on the substrate, optically or electrically. Alternatively, the fixture can be aligned to the substrate surface mechanically by using a pair of mechanical structures, such as mounting holes on the fixture and mounting cylinders on the substrate, or vice versa.

In step 830, hot pressing and curing of the ACP is performed to attach the fixture to the substrate. Hot pressing and curing of the ACP also results in an anisotropic electrical conduction in a direction of pressing (i.e., from the fixture to the substrate).

A test is conducted in step 840 to determine if the fixture is properly assembled on the substrate. If the fixture is not properly assembled, the fixture is either discarded or reworked in step 845, depending upon if the substrate or fixture has considerable value or how complicated it is in rework. If the cured fixture passes the test (i.e., it is well aligned to the substrate), then the ACM layer and component are placed at a target opening in the component fixture until all components are placed in step 850.

The opening in the fixture not only holds the component on the substrate accurately, but also ensures a contact array at a component package is in contact with a component's target land pattern fabricated on the substrate surface if the component is properly pressed from the top. The size of the fixture opening should match a dimensional outline of the component but still allow the component to be inserted and removed with ease. The ACM layer is suitable for components in a land grid array (LGA) package where no solder ball is attached to the package except in an array of bare contacts.

After placing components at the fixture openings with the ACM as the interconnect layer, a cover comprising a layer of elastic material on an inner surface, such as a thermal membrane, is then placed on top of the assembly to hold components in place in the fixture openings in step 860. A test is performed in step 870 to check if the components are properly assembled. If test fails, the cover is removed to reposition the displaced components or to replace a bad ACM membrane or a defective ACM laminated component in step 885. The process (i.e., steps 860-885) is repeated until the test is passed in step 880. Then, the electronic assembly comprising the top and the bottom covers is clamped, clipped, latched, or sealed to hold all components securely in the electronic assembly in step 890.

If both sides of the substrate are to be populated with components, then the one-side assembled substrate including bottom cover can be turned over after passing the test in step 880, and then steps 810 to 880 may be repeated to place a second fixture, ACM layers, and the components at a second surface of the substrate until the second side is fully assembled with components and passes the test.

In another embodiment of the invention, a second substrate may be used to facilitate the assembly of an electronic assembly with components assembled on both sides. After the assembled substrates pass test, the first assembled substrate and the second assembled substrate may be aligned and placed back to back with an anisotropic conducting membrane (ACM) in between to form a double-sided electronic assembly. If no electric connection is required between the first and the second substrates, a thermal membrane, paste, or glue may be used instead of the ACM.

In various embodiments of the invention, multiple fixtures, multiple ACMs, and multiple substrates may be stacked into a three dimensional (3D) structure to increase the integration density of an electronic assembly comprising detachable components, where the detachable component may be laminated with a separate ACM layer at its interface, or a separate ACM layer may be inserted at the interface between the component and the substrate underneath it. The combination of the ACM layer, the fixture, the ACM laminated or interfaced components at a fixture opening, and the substrate constituents a basic building block, namely a basic MFS (Membrane-Fixture-Substrate) configuration, for the construction of a stacked electronic assembly illustrated, for example, in FIG. 9. An ACM layer 915, 925, and 935 may be replaced by a thermal membrane, if the MFS basic building block does not electrically interface with other MFS configurations in the stacked assembly. The stacked assembly may be further enclosed and sealed in a housing, in some embodiments.

Figure 9:
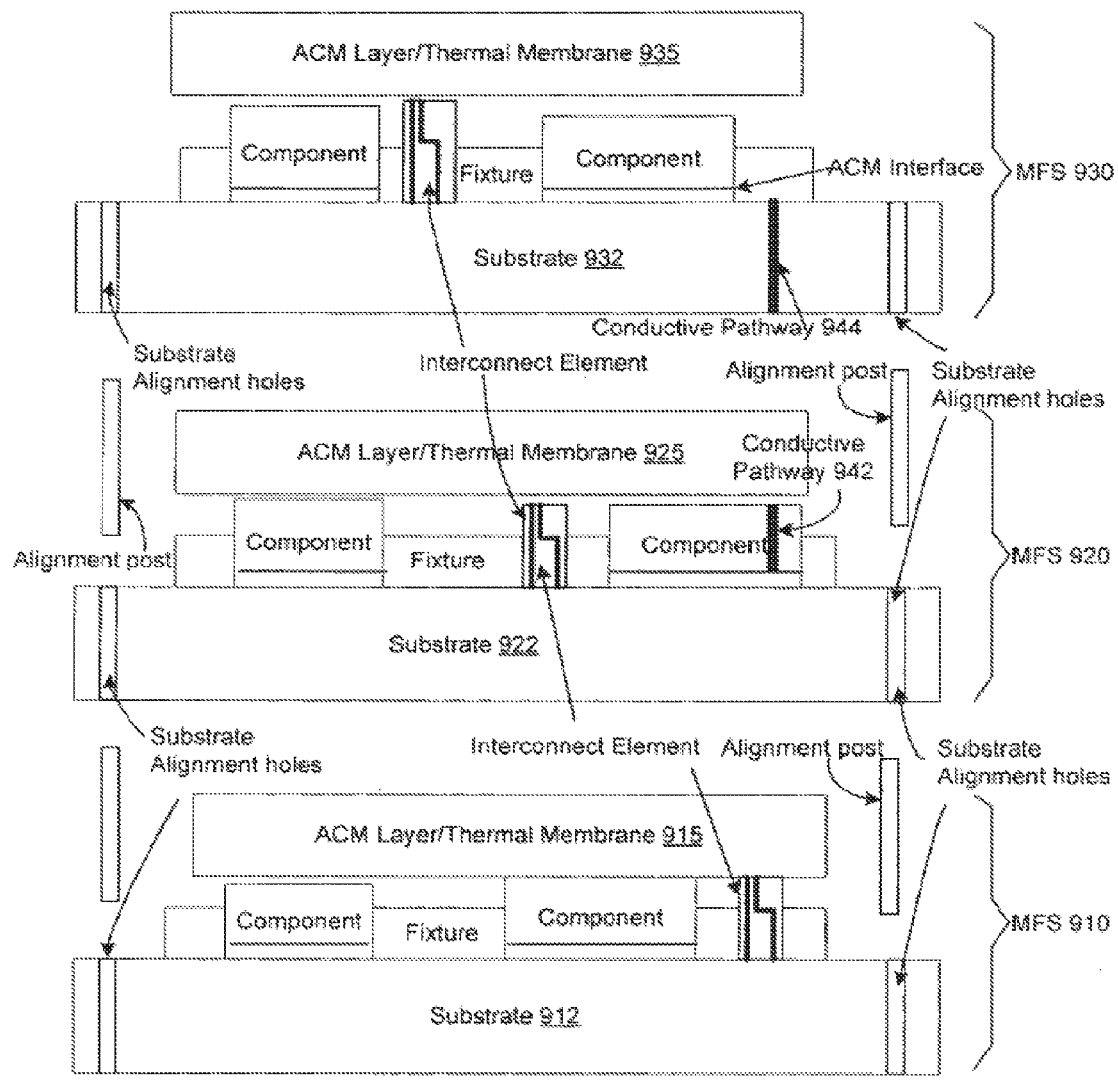
FIG. 9 depicts an exemplary stacked assembly comprising multiple MFSs in a cascade.

FIG. 9 is an exemplary embodiment of an assembly comprising three stacked MSF configurations 910, 920, and 930 in cascade. In this embodiment, the stacked MSFs are back to back and do not require a gap in between, so the components to the ACM layer or the thermal membrane also do not require a gap. The gaps shown in FIG. 9 are only for distinguishing the building blocks and associated constituents more clearly. A set of mounting holes and mounting cylinders may be used to align and to bind the multiple MFSs.

For each MFS, the ACM layer at the top can serve as an interconnect layer to the neighboring MFS at its top. To facilitate interconnection between neighboring MFSs, in various embodiments of the invention, a set of interconnect elements comprising conductive pathways or connection traces can be pre-fabricated as chips or planar elements for insertion into the fixture openings to connect the MFS to a neighboring MFS. The interconnect element functions as a connector connecting substrates at two neighboring MFSs through the ACM layers. The interconnect element can replace expensive mechanical connector, such as a Mictor connector, and a flexible circuitry seen in the electronic assemblies. There is an additional advantage for the interconnect element coupled with the ACM layer. The number and the locations of interconnect elements can be chosen freely within a fixture without the physical or location constraints encountered by the mechanical connectors or the flexible circuitries. Since both sides of substrate may be fabricated with interconnect circuitry to increase routing density, the interconnect elements provide needed interconnections between two neighboring substrates through the ACM layers. The passive components in an electronic assembly can be embedded in the fixture, embedded in the interconnect element, or solder mounted on the substrate surface in the MFS. Alternatively, a conductive pathway 942 associated with an alignment mark running from top to bottom in a component to be placed at the MFS can be used as an interconnection element between two neighboring MFSs through the ACM layers. Similarly, a conduction pathway 944 associated with reference mark running from top to bottom in a substrate can also be used as a connection for the neighboring MFSs.

An alignment chain is useful for diagnosing the positional and contact status of components in an electronic assembly comprising more complex structure, such as one with multiple stacked MFSs. The alignment chain is an optional feature for a simple electronic assembly, as the functional test may be adequate to determine if the ACM based component is properly assembled. But for a complex electronic assembly, an efficient way to identify the defective block is essentially to lower the test, debug, or rework costs. The alignment chain is a solution for a complex electronic assembly comprising a large number of detachable components or multiple MFSs. An alignment chain that links the conductive alignment marks for a group of components and the matching conductive reference marks at substrate into a serial conductive pathway is effective in detecting the assembly integrity for the group of components in the assembly. Multiple alignment chains divide the components in a complex electronic assembly into multiple sub-groups with access points attached to each smaller alignment chain to detect the positional and contact status of the ACM interfaced components segregated in a smaller region in the electronic assembly.

The present invention has been described with reference to exemplary embodiments. It will be apparent to those skilled in the art that various modifications may be made and that other embodiments can be used without departing from the broader scope of the present invention. For example, some electronic assemblies may comprise one or more alignment chains as well as one or more fixtures that may further comprise multiple layers of interconnect under various housings or enclosures. Therefore, these and other variations upon the exemplary embodiments are intended to be covered by the present invention.

What is claimed is:

1. An electronic assembly comprising:
   a substrate including a first contact array;
   an electronic component including a second contact array;
   a fixture including an opening adapted to position the electronic component on the substrate and to connect the second contact array to the first contact array when the fixture is aligned at a first position on the substrate;
   a housing adapted to hold the substrate populated with the electronic component, the housing including a first conductive pathway adapted to connect from an external surface at the housing to the substrate in a serial continuous conductive path when the fixture is aligned at the first position on the substrate; and
   a sensing device attached to the serial continuous conductive path, wherein the sensing device includes a latch adapted to monitor the integrity of the serial continuous conductive path.

2. The electronic assembly of claim 1, wherein the electronic component includes a second conductive pathway, the substrate includes a third conductive pathway, and the serial continuous conductive path includes the first, second and third conductive pathways.

3. The electronic assembly of claim 1, wherein the fixture includes a second conductive pathway, the substrate includes a third conductive pathway, and the serial continuous conductive path includes the first, second and third conductive pathways.

4. The electronic assembly of claim 1, wherein the fixture includes an alignment mark and the substrate includes a reference mark adapted to align to the alignment mark when the fixture is aligned at the first position on the substrate.

5. The electronic assembly of claim 1, wherein the fixture is detachable from the substrate.

6. The electronic assembly of claim 1, wherein the fixture is adapted to align to the substrate by an optical pattern recognition technique.

7. The electronic assembly of claim 1, wherein the opening at the fixture is embossed as a cavity at the substrate.

8. The electronic assembly of claim 1, wherein the fixture is bonded to the substrate with an anisotropic conductive paste.

9. The electronic assembly of claim 1, wherein the fixture includes an interconnection trace.

10. The electronic assembly of claim 1, wherein the fixture includes a passive component selected from the group consisting of a resistor, a capacitor, and an inductor.

11. The electronic assembly of claim 1, wherein the electronic component is selected from the group consisting of an integrated circuit, a packaged device, a stacked device, a sensor, an electro-mechanical element, and a bare die.

12. The electronic assembly of claim 1 further comprising an anisotropic conducting material between the electronic component and the substrate.

13. The electronic assembly of claim 1 further comprising an anisotropic conducting material between the fixture and the substrate.

14. The electronic assembly of claim 1, wherein the serial continuous conductive path is connected to power or ground.

15. The electronic assembly of claim 1, wherein the substrate includes the sensing device.

16. The electronic assembly of claim 1, wherein the electronic component includes the sensing device.

17. The electronic assembly of claim 1, wherein the housing is adapted to securely hold the electronic component in contact with the substrate.

18. The electronic assembly of claim 1, wherein the housing is clamped, clipped, latched, sealed, or ultrasonic welded.

19. The electronic assembly of claim 1, wherein the housing includes a form selected from the group consisting of a clamshell, a heat spreader, a plastic housing, and a cover.

20. The electronic assembly of claim 1, wherein the housing is removable.

21. The electronic assembly of claim 1 further comprising a thermal membrane between an inner surface of the housing and the electronic component, the thermal membrane adapted to transfer heat from the electronic component to the housing.

22. The electronic assembly of claim 1, wherein the serial continuous conductive path is adapted to detect a placement integrity of the electronic component on the substrate by a signal detectable at the housing.

23. A method for assembling an electronic assembly, the method comprising:
provide a substrate including a first contact array;
providing an electronic component including a second contact array
positioning the electronic component on the substrate at an opening in a fixture;
connecting the second contact array to the first contact array when the fixture is aligned at a first position on the substrate;
holding the substrate populated with the electronic component by a housing;
connecting a first conductive pathway from an external surface at the housing to the substrate in a serial continuous conductive path when the fixture is aligned at the first position on the substrate;
attaching a sensing device to the serial continuous conductive path; and
monitoring the integrity of the serial continuous conductive path by a latch at the sensing device.

24. The method of claim 23, wherein the electronic component includes a second conductive pathway, the substrate includes a third conductive pathway, and the serial continuous conductive path includes the first, second and third conductive pathways.

25. The method of claim 23, wherein the fixture includes a second conductive pathway, the substrate includes a third conductive pathway, and the serial continuous conductive path includes the first, second and third conductive pathways.

26. The method of claim 23 further comprising aligning an alignment mark at the fixture to a reference mark at the substrate when the fixture is aligned at the first position on the substrate.

27. The method of claim 23, wherein the fixture is detachable from the substrate.

28. The method of claim 23 further comprising aligning the fixture to the substrate by an optical pattern recognition technique.

29. The method of claim 23 further comprising embossing the opening at the fixture as a cavity at the substrate.

30. The method of claim 23 further comprising bonding the fixture to the substrate with an anisotropic conductive paste.

31. The method of claim 23, wherein the fixture includes an interconnection trace.

32. The method of claim 23, wherein the fixture includes a passive component selected from the group consisting of a resistor, a capacitor, and an inductor.

33. The method of claim 23, wherein the electronic component is selected from the group consisting of an integrated circuit, a packaged device, a stacked device, a sensor, an electro-mechanical element, and a bare die.

34. The method of claim 23 further comprising providing an anisotropic conducting material between the electronic component and the substrate.

35. The method of claim 23 further comprising providing an anisotropic conducting material between the fixture and the substrate.

36. The method of claim 23 further comprising connecting serial continuous conductive path to power or ground.

37. The method of claim 23, wherein the substrate includes the sensing device.

38. The method of claim 23, wherein the electronic component includes the sensing device.

39. The method of claim 23 further comprising securely holding the electronic component in contact with the substrate by the housing.

40. The method of claim 23, wherein the housing is clamped, clipped, latched, sealed, or ultrasonic welded.

41. The method of claim 23, wherein the housing includes a form selected from the group consisting of a clamshell, a heat spreader, a plastic housing, and a cover.

42. The method of claim 23, wherein the housing is removable.

43. The method of claim 23 further comprising:
providing a thermal membrane between an inner surface of the housing and the electronic component; and
transferring heat from the electronic component to the housing through the thermal membrane.

44. The method of claim 23 further comprising detecting a placement integrity of the electronic component on the substrate by a signal on the serial continuous conductive path detectable at the housing.

\* \* \* \* \*